United States Patent
Mandal et al.

(10) Patent No.: US 10,837,926 B2
(45) Date of Patent: Nov. 17, 2020

(54) MULTI-MODAL SPECTROSCOPIC ANALYSIS

(71) Applicants: Case Western Reserve University, Cleveland, OH (US); University of Florida Research Foundation, Inc., Gainesville, FL (US)

(72) Inventors: Soumyajit Mandal, Shaker Heights, OH (US); Swarup Bhunia, Gainesville, FL (US); Naren Vikram Raj Masna, Gainesville, FL (US); Cheng Chen, Cleveland, OH (US); Mason Greer, Cleveland, OH (US); Fengchao Zhang, Folsom, CA (US)

(73) Assignees: CASE WESTERN RESERVE UNIVERSITY, Cleveland, OH (US); UNIVERSITY OF FLORIDA RESEARCH FOUNDATION, Gainesville, FL (US)

( * ) Notice: Subject to any disclaimer, the term of this patent is extended or adjusted under 35 U.S.C. 154(b) by 50 days.

(21) Appl. No.: 16/121,439

(22) Filed: Sep. 4, 2018

(65) Prior Publication Data
US 2019/0072506 A1    Mar. 7, 2019

Related U.S. Application Data

(60) Provisional application No. 62/553,481, filed on Sep. 1, 2017.

(51) Int. Cl.
*G01N 24/08* (2006.01)
*G01N 21/359* (2014.01)
(Continued)

(52) U.S. Cl.
CPC .......... *G01N 24/08* (2013.01); *G01N 21/359* (2013.01); *G01N 21/94* (2013.01);
(Continued)

(58) Field of Classification Search
CPC ...... G01N 24/08; G01N 21/359; G01N 21/94; G01N 21/9508; G01R 33/441; G01R 33/448; G01R 33/4625
(Continued)

(56) References Cited

U.S. PATENT DOCUMENTS 5,254,950 A  * 10/1993  Fan ................... G01R 33/0356
                                                          324/322
6,420,869 B1 *  7/2002  DiFoggio ............ G01N 21/359
                                                          324/300
(Continued)

FOREIGN PATENT DOCUMENTS

WO    WO-2013033638 A2 *  3/2013  ............. G16C 20/20
WO    WO-2013033638 A3 *  9/2013  ............. G16C 20/20

OTHER PUBLICATIONS

Xua et al., Hybrid MmEar Infrared Imaging of the Murine Brain: Optimization of Optical Fiber Arrangement and Use of A-Priori Knowledge. Thayer School of Enginnering, Dartmouth College, (b) Department of Radiology, Dartmouth Medical School Hanover. NH 03755. IEEE (Year: 2002).*

(Continued)

*Primary Examiner* — Patrick Assouad
*Assistant Examiner* — Sean Curtis
(74) *Attorney, Agent, or Firm* — Tarolli, Sundheim, Covell & Tummino LLP

(57) ABSTRACT

An example includes performing near infra-red (NIR) spectrometry to provide NIR measurement data for a sample compound. The method also includes performing magnetic resonance (MR) spectrometry to provide MR measurement data for the sample compound. The method also includes analyzing, by a computing device, the MR measurement data in view of the NIR measurement data to characterize the sample compound.

25 Claims, 8 Drawing Sheets

(51) Int. Cl.
   *G01N 21/94*   (2006.01)
   *G01N 21/95*   (2006.01)
   *G01R 33/46*   (2006.01)
   *G01R 33/44*   (2006.01)

(52) U.S. Cl.
   CPC ....... *G01N 21/9508* (2013.01); *G01R 33/441* (2013.01); *G01R 33/448* (2013.01); *G01R 33/4625* (2013.01)

(58) Field of Classification Search
   USPC .................................................. 324/300–322
   See application file for complete search history.

(56) References Cited

U.S. PATENT DOCUMENTS

| | | | | |
|---|---|---|---|---|
| 6,562,627 | B1* | 5/2003 | Pidgeon ................ | G01N 30/02 210/198.2 |
| 6,937,020 | B2* | 8/2005 | Munson ............... | G01R 33/307 324/320 |
| 7,002,346 | B2* | 2/2006 | Schaepman ........... | G01K 7/42 177/50 |
| 8,497,683 | B2* | 7/2013 | Trygstad .............. | G01R 33/31 324/321 |
| 9,360,421 | B2* | 6/2016 | Lanan ................. | G01R 33/465 |
| 9,476,847 | B2* | 10/2016 | Trygstad .............. | G01N 24/08 |
| 9,554,738 | B1* | 1/2017 | Gulati ................ | A61B 5/0075 |
| 9,903,810 | B2* | 2/2018 | Trygstad .............. | G01N 21/65 |
| 10,175,218 | B2* | 1/2019 | Visser ................ | G01N 21/359 |
| 2003/0097059 | A1* | 5/2003 | Sorrell ............... | G01R 33/4625 600/420 |
| 2003/0124028 | A1* | 7/2003 | Carlson ............... | G01N 33/15 422/68.1 |
| 2005/0242811 | A1* | 11/2005 | Schaepman ........... | G01N 24/085 324/315 |
| 2007/0054347 | A1* | 3/2007 | Rosendahl ............ | A61B 5/14542 435/25 |
| 2007/0184455 | A1* | 8/2007 | Arrowsmith .......... | G01N 24/088 435/6.12 |
| 2009/0179341 | A1* | 7/2009 | McCausland .......... | G01N 23/20 264/9 |
| 2009/0203991 | A1* | 8/2009 | Papaioannou ......... | A61B 5/6852 600/421 |
| 2010/0066374 | A1* | 3/2010 | Trygstad ............. | G01R 33/307 324/321 |
| 2010/0125176 | A1* | 5/2010 | Hyde ................. | A47G 21/04 600/300 |
| 2010/0125177 | A1* | 5/2010 | Hyde ................. | G09B 19/0092 600/300 |
| 2010/0125178 | A1* | 5/2010 | Hyde ................. | G09B 19/0092 600/300 |
| 2010/0125180 | A1* | 5/2010 | Hyde ................. | G01G 19/40 600/300 |
| 2010/0125181 | A1* | 5/2010 | Hyde ................. | G06F 19/3475 600/300 |
| 2010/0125417 | A1* | 5/2010 | Hyde ................. | A47G 21/04 702/19 |
| 2010/0125419 | A1* | 5/2010 | Hyde ................. | G01N 33/02 702/19 |
| 2011/0016950 | A1* | 1/2011 | Ducreux .............. | G01N 1/2214 73/23.42 |
| 2012/0173154 | A1* | 7/2012 | Rosendahl ........... | A61B 5/14542 702/19 |
| 2013/0342203 | A1* | 12/2013 | Trygstad ............. | G01N 33/2823 324/309 |
| 2014/0353503 | A1* | 12/2014 | Lanan ................ | G01N 21/359 250/339.01 |
| 2015/0198538 | A1* | 7/2015 | Trygstad ............. | G01N 21/65 702/25 |
| 2017/0059571 | A1* | 3/2017 | Lam .................. | G01R 33/465 |
| 2018/0216016 | A1* | 8/2018 | Bakas ................ | B01J 19/0033 |
| 2019/0072506 | A1* | 3/2019 | Mandal ............... | G01N 21/94 |
| 2019/0234869 | A1* | 8/2019 | Sajjadi .............. | G01N 21/4795 |
| 2019/0269576 | A1* | 9/2019 | Grosfils ............. | A61J 1/035 |
| 2020/0158565 | A1* | 5/2020 | Fuse ................. | G01J 1/0407 |

OTHER PUBLICATIONS

Masna, et al., "Authentication of dietary supplements through Nuclear Quadrupole Resonance (NQR) spectroscopy", International Journal of Food Science and Technology, Dec. 2018, 53, pp. 2796-2809.

Chen, et al., "Broadband quantitative NQR for authentication of vitamins and dietary supplements", Journal of Magnetic Resonance 278, May 2017, pp. 67-79.

Grassi, et al., "Handheld NIR device: A non-targeted approach to assess authenticity of fish fillets and patties", Food Chemistry 243, Mar. 2018, pp. 382-388.

Barras, et al., "Nitrogen-14 Nuclear Quadrupole Resonance Spectroscopy: A Promising Analytical Methodology for Medicines Authentication and Counterfeit Antimalarial Analysis", American Chemical Society, Feb. 2013, 85, pp. 2746-2753.

Guillemain, et al., "Performance of NIR handheld spectrometers for the detection of counterfeit tablets", Talanta 165, Apr. 2017, pp. 632-640.

Rodionova, et al., "Qualitative and quantitative analysis of counterfeit fluconazole capsules: A non-invasive approach using NIR spectrosopy and chemometrics", Talanta 195, Apr. 2019, 662-667.

Karunathilaka, et al., "Rapid screening of commercial extra virgin olive oil products for authenticity: Performance of an handheld NIR device", NIR news, Feb. 2017, vol. 28(1), pp. 9-14.

* cited by examiner

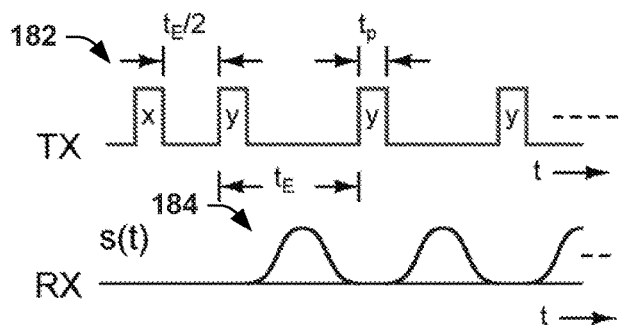
FIG. 5A
| PARAMETER | RANGE |
|---|---|
| RF FREQUENCY ($f_{RF}$) | 0.9-3.1 MHz |
| PULSE LENGTH ($t_p$) | 50-500 µs |
| PULSE SPACING ($t_E$) | 0.5-4 MS |
| PEAK POWER LEVEL ($P_{RF}$) | 1-100 W |
FIG. 5B
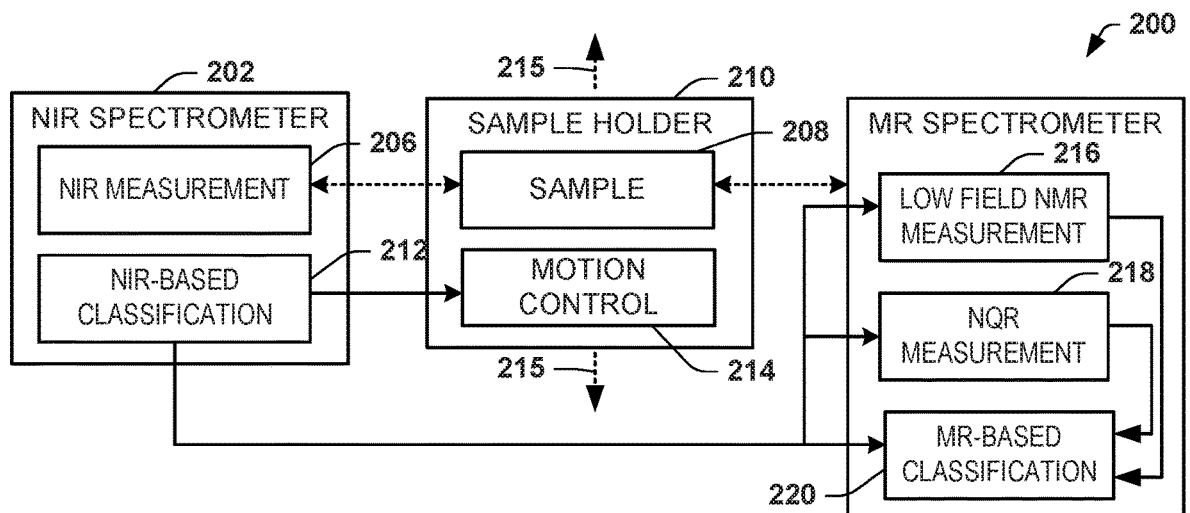
FIG. 6

MULTI-MODAL SPECTROSCOPIC ANALYSIS

CROSS-REFERENCE TO RELATED APPLICATION

This application claims priority from U.S. provisional application No. 62/553,481, filed 1 Sep. 2017, and entitled MULTI-MODAL SPECTROSCOPIC ANALYSIS, which is fully incorporated herein by reference.

GOVERNMENT INTEREST

This invention was made with government support under the grant NSF CCF-1563688 awarded by the National Science Foundation and the grant NSF CCF-1563924 awarded by the National Science Foundation. The government has certain rights in the invention.

TECHNICAL FIELD

This disclosure relates to a multi-modal spectroscopic analysis technique.

BACKGROUND

Poor quality, falsified, and contaminated medicines, dietary supplements and other consumable food products present an urgent public health concern. Falsified or substandard medicines with altered or non-existent active pharmaceutical ingredients (APIs) are now widespread in the pharmaceutical supply chain. Current "track and trace" approaches authenticate the packet, not the contents. They are vulnerable to the "seal of approval" trap—people assume the packet is genuine simply because it has a security mark, and don't bother to check the code. Several technologies have been developed for medicine authentication, but the most common way is still visual inspection of the packaging and contents.

SUMMARY

This disclosure provides systems and methods to perform multi-modal spectroscopic analysis.

In one example, a method includes performing near infra-red (NIR) spectrometry to provide NIR measurement data for a sample compound. The method also includes performing magnetic resonance (MR) spectrometry to provide MR measurement data for the sample compound. The method also includes analyzing, by a computing device, the MR measurement data in view of the NIR measurement data to characterize the sample compound.

In another example, a system includes a sample space to receive a volume of a sample compound therein. A near infra-red (NIR) spectrometer is to record NIR measurements for the sample compound within the sample space. A magnetic resonance (MR) spectrometer is to record MR measurements for the sample compound within the sample space. A non-transitory memory is to store NIR data based on the NIR measurements, MR data based on the MR measurements, and machine readable instructions executable by a processor to perform a method that includes analyzing the NIR data and the MR data to characterize the sample compound.

In yet another example the systems and methods herein can implement the MR measurements to include nuclear quadrupole resonance and/or nuclear magnetic resonance.

BRIEF DESCRIPTION OF THE DRAWINGS

FIGS. 5A and 5B depicts an example of a pulse sequence and example parameter values for performing NQR spectrometry.

FIG. 6 depicts an example of another system characterize a sample compound to characterize a sample compound using a combination NIR, low field NMR and NQR spectroscopy.

DETAILED DESCRIPTION

This disclosure provides systems and methods to perform multi-modal spectroscopic analysis, such as to authenticate consumable sample compounds (e.g., food and drugs). Systems and methods disclosed herein combine near infra-red (NIR) spectroscopy and one or more forms of magnetic resonance (MR) spectroscopy, in which the combined results provide different, but complementary spectral contrast characteristics used for authentication of the sample compound. For example, NIR spectroscopy may be combined with nuclear quadrupole resonance (NQR) spectroscopy and/or low field nuclear magnetic resonance (NMR) spectroscopy to determine an identity of (e.g., authenticate) a sample compound.

As an example, a device may include an NIR spectrometer integrated with an NQR spectrometer and/or an NMR spectrometer. Feature data derived from the NIR spectrometry can be utilized to drive control and/or analysis of analyze the NQR measurement data and/or NMR measurement data to determine the identity of the sample compound. The systems and method may be implemented in a device (e.g., portable device) to enable rapid, accurate, and quantitative authentication for a sample compound. Since the device is configured to perform NIR in combination with NQR and/or NMR measurements, precise diagnosis of a variety of sample compounds is facilitated.

Figure 1:
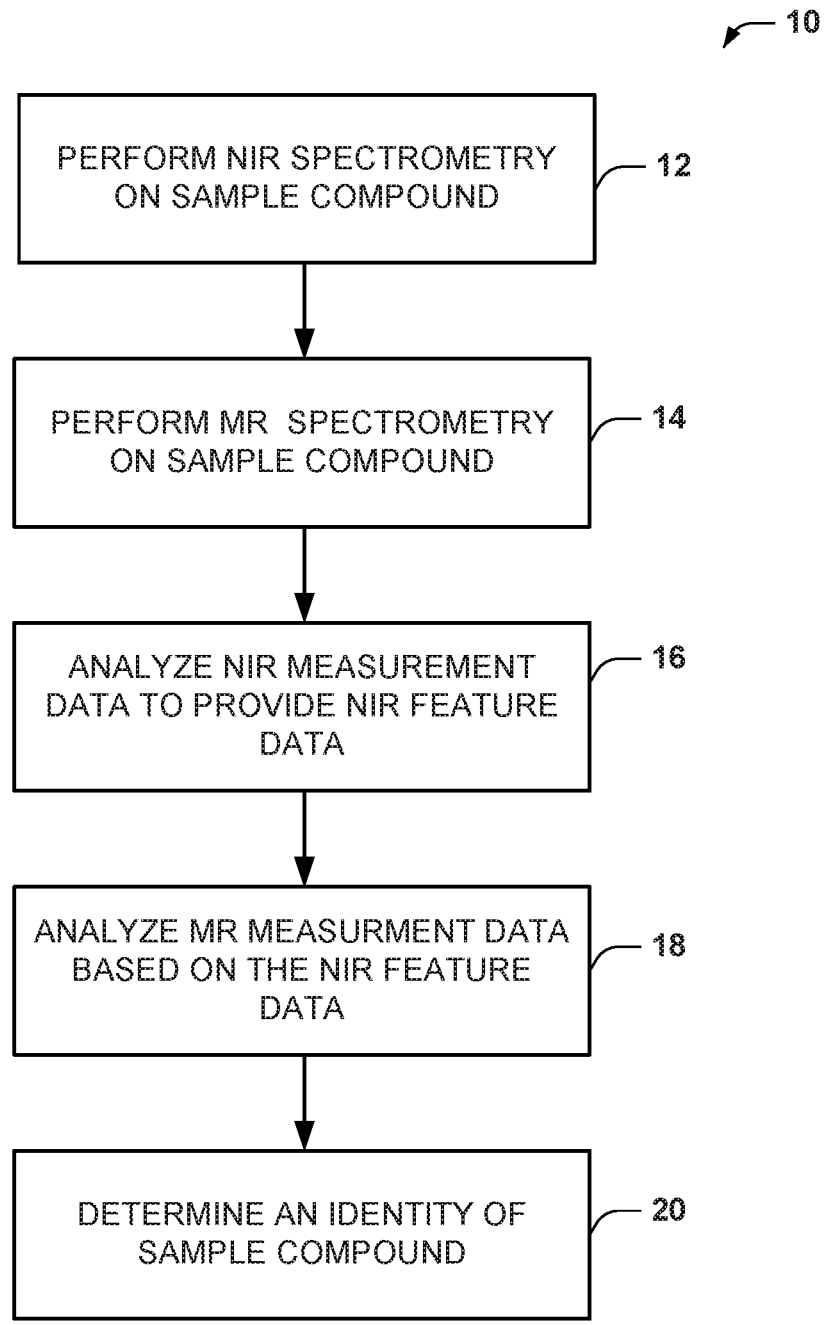
FIG. 1 depicts an example of a method to characterize a sample compound.

FIG. 1 depicts an example of a method 10 to characterize sample compounds. As disclosed herein the method combines near infra-red (NIR) spectrometry and nuclear quadrupole resonance (NQR) spectrometry to characterize a sample compound, such as a drug compound (e.g., drug), a dietary supplement or other consumable product. Some examples of consumable food products include: dietary supplements, beverages, food additives, infant formulas and other food products (e.g., natural and/or processed foods). Some examples of consumable drug products include: prescription drugs (both brand-name and generic), non-prescription (over-the-counter) drugs, biologics (e.g., vaccines, blood and blood products, cellular and gene therapy products, tissue and tissue products, allergenics). Other consumable products may include cosmetics, veterinary products, and tobacco products to name a few.

NIR provides different spectroscopic information on the sample that is complementary to that provided by MR (e.g., NQR and/or NMR). Thus, by utilizing NIR to generate an initial classification of the sample compound, the scan time and/or subsequent data processing time association with the NQR and/or NMR can be significantly reduced. The system can make both NIR and MR measurements simultaneously or sequentially, enabling precise identification and authentication of a variety of sample compounds such as disclosed herein.

At 12, the method of FIG. 1 includes performing NIR spectrometry to provide NIR measurement data for a sample compound. As used herein, NIR spectrometry refers to a spectroscopic method that uses the near-infrared region of the electromagnetic spectrum (e.g., from about 700 nm to 2500 nm). For example, NIR spectrometry is based on optical detection of harmonics (overtones) and combinations of resonance lines corresponding to molecular vibrations (bending and stretching modes). The fundamental lines occur in the mid- and far-IR regions. Overtone and combination lines are forbidden by quantum mechanical selection rules. Hence their amplitudes are relatively small, making NIR penetration depths relatively large (~1-2 mm in organic matter). However, NIR spectra are still sensitive to packaging and coatings, such as are often used on a variety of sample compounds, such as medicinal compounds and supplements.

At 14, the method includes performing one or more types of magnetic resonance (MR) spectrometry to provide MR measurement data for the sample compound. As mentioned, the MR spectrometry may include NQR and/or NMR spectrometry.

NQR is a non-invasive, non-destructive, and quantitative radio frequency (RF) spectroscopic technique. NQR spectra are generated by resonant transitions between nuclear energy levels created by the interaction between the electric quadrupole moments of certain nuclei (e.g., can focus on nitrogen, i.e., $^{14}N$) and their local electric field gradient (EFG) tensors. The spectroscopic technique is sensitive to subtle features of the solid-state chemical environment of the nuclei and thus generates unique chemical fingerprints that are intrinsically difficult to replicate. For example, many medicines and other consumables are nitrogen-rich compounds, and are thus highly sensitive to NQR. Moreover, NQR is also sensitive to the manufacturing process, creating a unique high-resolution fingerprint for each compound and manufacturer methods. NQR is also a bulk method that is insensitive to packaging, coatings, and other surface conditions.

NMR spectroscopy (also known as magnetic resonance spectroscopy (MRS)) is a spectroscopic technique to observe local magnetic fields around atomic nuclei. The sample compound is placed in a magnetic field and the NMR signal is produced by excitation of the nuclei sample with radio waves into nuclear magnetic resonance, which is detected with one or more radio receivers. The intramolecular magnetic field around an atom in a molecule changes the resonance frequency, thus giving access to details of the electronic structure of a molecule and its individual functional groups. NMR spectroscopy can thus identify monomolecular organic compounds or other complex molecules. NMR spectra are unique, well-resolved, analytically tractable and often highly predictable for small molecules, including when contained in wet consumable products.

At 16, the NIR measurement data is analyzed to provide NIR feature data. For example, the feature data can be generated as a feature vector having a plurality of data points that characterize optical properties of the sample compound. In some examples, the analysis at 16 can include searching one or more predetermined NIR databases based on the feature data to provide NIR results data. The NIR results data thus may specify a category of the sample compound and/or a preliminary identity (or a plurality of preliminary identities) to provide an initial classification for the sample compound. In some examples, the NIR results data includes a ranking among a plurality of categories of the sample compound and/or a plurality of potential identities of the sample compound based on the analysis of the NIR data. The ranking can be based on a probability or likelihood of a match between the NIR data and the records in the NIR database(s). Since the NIR measurement data may include a large number of overlapping lines, the NIR database may be constructed using chemometric analysis, such as pattern recognition and/or machine learning methods. For example, machine learning can include use of a specially-programmed computer implementing support vector machines (SVMs), deep neural networks (DNNs), and extreme learning machines (ELMs) to name a few.

In another example, the analysis of NIR measurement data may be performed before performing the MR spectrometry at 14. In this example, the NIR feature data may be used to control one or more parameters for controlling the MR spectrometry. For example, the NIR results can select or configure or control the magnetic field that is generated, the position of the sample compound within the field or the like.

At 18, the method includes analyzing the MR measurement data based on the NIR feature data to characterize properties of the sample compound. For example, the results data from 16 may be utilized to analyze selected portions of the MR measurement data. At 20, an identity of the sample compound is determined based on the analysis at 18. For example, a search of one or more MR databases is performed based on spectrometric information obtained from the MR measurement data. The searching of the MR database may be constrained based on the NIR results data (e.g., based on the category and/or preliminary identity of the compound derived from the NIR spectrometry) and/or based on one or more expected identities of the compound. For example, the search of the MR database operates to validate the identity of the sample compound specified in the NIR results data. In some examples, such as when the sample compound has a known or expected identity that requires authentication, the MR analysis and searching can be focused to either validating or invalidating the known or expected identity of the sample compound, such as by searching a reduced subset of the MR database that has been defined from (e.g., constrained or filtered by) the NIR results data. Additionally or alternatively, the quantitative analysis and searching based on the MR data may determine an amount of the sample compound.

While MR measurements (e.g., NQR or low field NRM) individually, tend to be time-consuming (e.g., taking several minutes), when such MR spectroscopy is combined with NIR spectrometry (e.g., using NIR results data) as disclosed herein, the overall method of FIG. 1 can be implemented to identify the sample compound in real time or near-real time. For example, the method can be implemented using a device (e.g., a portable NIR/MR system) that includes a miniaturized NIR spectrometer integrated with one or more miniaturized MR spectrometers for rapid, accurate, and quantitative materials authentication of food, drugs and other consumables. The NIR spectrometry and the MR spectrometry can be performed on a given sample compound sequentially or concurrently within a common housing, for example. As disclosed herein, the NIR results data can drive the NQR analysis to facilitate compound identification and/or authentication. The housing can include data processing and memory to analyze measurements and databases accordingly. Additionally or alternatively, the housing that contains the NIR and MR spectrometry devices can interface with an external computing device (e.g., desktop computer, laptop, tablet or smart phone), which can perform some or all of the data analysis and database searching.

Figure 2:
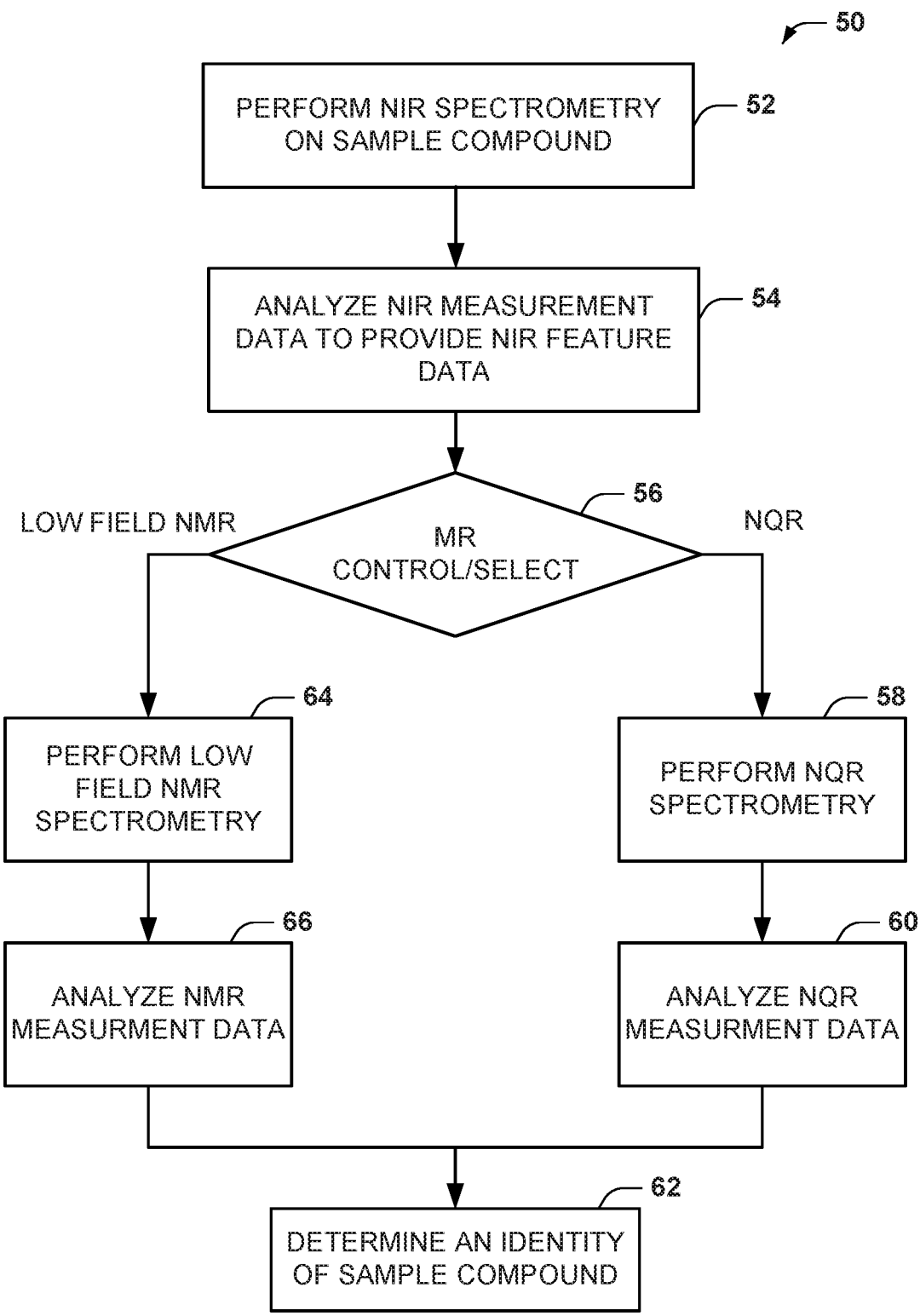
FIG. 2 depicts an example of another method to characterize a sample compound.

FIG. 2 depicts an example of another method 50 to characterize the identity of a sample compound. Similar to the example method 10 of FIG. 1, the method 50 may be implemented by a portable device configured to receive a sample compound. A computing device may be integrated in the same portable device or be connected to such device via a physical or wireless interface for communicating data and instructions relating to the method. At 52, the method 50 includes NIR spectroscopy to provide NIR measurement data for a sample compound (e.g., food, drug, supplement or other consumable). At 54, the NIR measurement data is analyzed to provide NIR feature data to characterize optical properties of the sample compound. In some examples, the analysis at 54 can include searching one or more predetermined NIR databases based on the feature data to provide NIR results data. As mentioned, the database can be stored in non-transitory media of the portable device or in a remote computing device that is accessible via a communications link for use in such analysis at 54. The analysis at 54 can provide output analysis data specifying an initial classification for the sample compound. The analysis data can include more than one initial classification and each can be ranked in order of a computed confidence based on the analysis at 54.

At 56, a decision is made (e.g., by program code executed by a computing device) to control one or more MR spectroscopic processes and/or select which one or more the of MR spectroscopic measurements to perform. In this example, the determination at 56 can include selecting and/or controlling low field NMR, selecting and/or controlling NQR or a combination thereof. The determination at 56 can be made based on the feature data and/or results data from the analysis of NIR data (at 54). In response to determining to perform NQR, the method proceeds to 58 to perform NQR spectrometry. Controls and operating parameters for performing the NQR spectrometry at 58 can be configured based on the analysis at 54. For example, the computing device and/or controller may configure one or more control parameters, such as field strength, duration of field, controls to position the sample (e.g., based on the feature data and/or results data at 54).

At 60, the method includes analyzing the NQR measurement data. The analysis at 60 can be based on the NIR feature data and/or results data (e.g., based on one or more initial classifications) to facilitate further characterization of properties of the sample compound. For example, the results data from 54 may be utilized to analyze selected portions of the NQR measurement data.

At 62, an identity of the sample compound is determined, such as to authenticate the sample compound as valid or invalidate the compound as being non-authentic. This can be based on the analysis of NQR data at 60 and/or analysis of other MR data, which in this example includes analysis of low field NMR data.

In response to determining (at 56) to implement low field NMR spectrometry, the method proceeds to 64 to perform low field NMR spectrometry. Controls and operating parameters for performing the low field NMR spectrometry at 64 can be configured based on the analysis at 54. The low field NMR may be performed in place of or in addition to the NQR spectrometry at 56 (e.g., sequentially or concurrently). For example, the computing device and/or controller may configure one or more NMR control parameters, such as field strength, duration of field, controls to position the sample with respect to the magnetic field (e.g., based on the feature data and/or results data at 54). At 66, the NMR measurement data is analyzed. The analysis of NMR data at 66 can be implemented based on the NIR feature data and/or NIR results data.

As a further example, the identity or authentication of the sample compound determined at 62 can be determined based on conducting a search of one or more databases, including an NQR database and/or NMR database. The database search can be based on spectrometric information obtained from the NQR and/or NMR results data. For example, the search of the NQR and/or NMR databases operates to validate the identity of the sample compound, such as for authentication thereof for a variety of purposes. As mentioned above, the authentication process at 62 may be constrained based on the NIR results data (e.g., based on the category and/or preliminary identity of the compound derived from the NIR spectrometry) and/or based on one or more expected identities of the compound.

While NQR and low field NMR measurements and analysis, individually, tend to be time-consuming (e.g., taking several minutes), when combined with NIR spectrometry (e.g., using NIR results data), as disclosed herein, the overall method 50 can be implemented to identify the sample compound in real time or near-real time. This is because, as disclosed herein, the NIR results data can drive the NQR and NMR analysis to facilitate compound identification and/or authentication. Additionally, the same magnetic field source can be used to generate the field for both NQR and NMR, which may be performed sequentially or concurrently.

Figure 3:
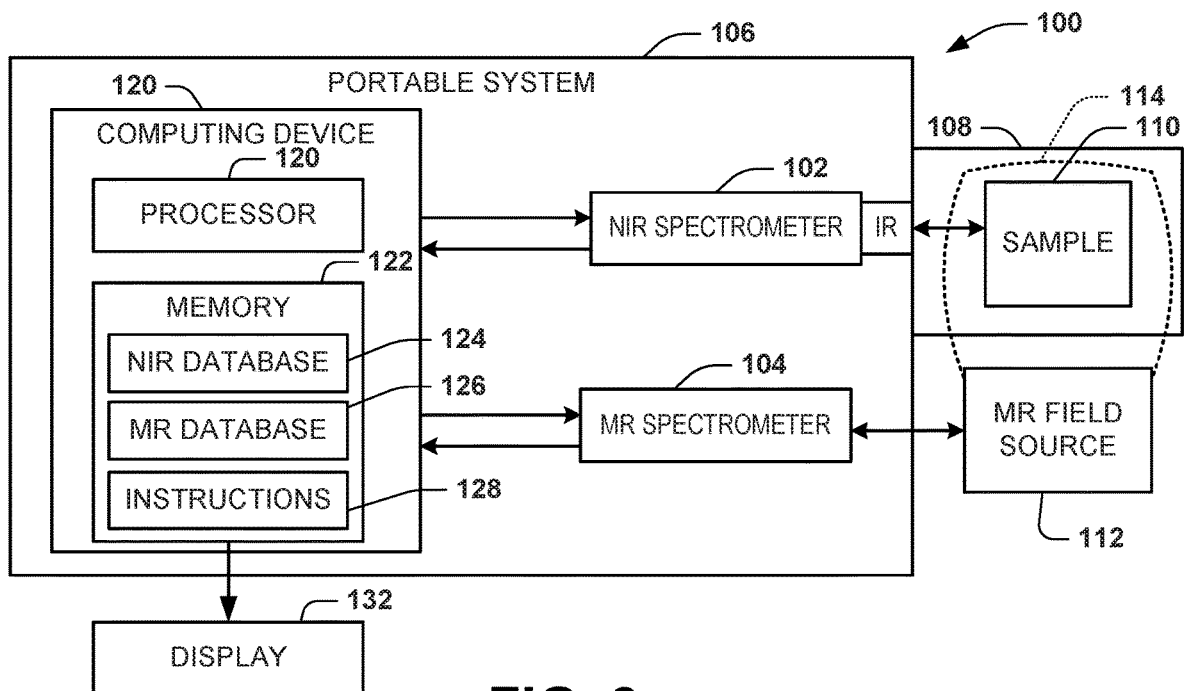
FIG. 3 depicts an example of a system to characterize a sample compound using NIR and MR spectroscopy.

FIG. 3 depicts an example of a system 100 to characterize a sample compound using multi-modal spectral analysis, which includes NIR in combination one or more forms of MR measurement and analysis. The system 100 includes an NIR spectrometer 102 to record NIR measurements for the sample compound and an MR spectrometer 104 to record MR measurements (e.g., low field NMR or NQR measurements) for the sample compound. The type of MR utilized can be configured according to the type of compound. In this example, the system 100 is an integrated system that includes a housing 106 that contains the NIR spectrometer 102 and the MR spectrometer 104, which can be sufficiently small to enable portability by a single person. For example, the system 100 includes a sample space 108 to receive a volume of the sample compound 110 therein. The sample space 108 may be within the housing 106 or be external to the housing. The sample space 108 for example can include a receptacle or other sample holder to receive the sample compound 110 being tested.

As an example, the NIR spectrometer 102 includes an infrared (IR) transceiver that includes a light source (e.g., incandescent light bulb or LED), a detector (e.g., charge-coupled devices (CCDs) or other silicon-based detectors, InGaAs photodiodes, etc.). The IR transceiver also includes a dispersive element (such as a prism, or, more commonly, a diffraction grating) to allow the intensity at different wavelengths to be recorded by the detector.

As a further example, an MR field source 112, which may include an electromagnet or a permanent magnet, configured to generate a magnetic field 114 in the sample space 108 for subjecting the sample to the field for implementing MR spectrometry. The MR spectrometer 104 measures the electromagnetic spectrum from the sample in response to the magnetic field from the field source 112 to provide corresponding MR data. The magnetic field 114 may be static or variable such as in response to control commands from a computing device 118, such as depending on the type of MR spectroscopy being implemented. As disclosed herein, the MR spectrometer 104 can be implemented as a low field NMR spectrometer or an NQR spectrometer. As used herein in relation to NMR, "low-field" refers to a generating a magnetic field ($B_0$) without the aid of superconductors. In practice, this usually restricts the $B_0$ field strength up to about 1 T. In an example MR system configured to perform NQR, the magnetic field applied to the sample is even smaller than NMR, such as less than about 0.5 mT.

The sample space may be fixed spatially with respect to the magnetic field or it may be movable with respect to the field. Movement of the sample with respect to a stationary field can be used to vary the field that is applied to the sample. In other examples, the field source 112 can be controlled by MR controls of the MR spectrometer to control the field (e.g., based on control instructions from computing device 120). For example, the MR spectrometer 104 includes a radio frequency (RF) power source, a coil to produce the magnetic excitation field and a detector circuit which monitors for an RF MR response from sample under test (in the sample space 108). The detector circuit can include a matching network and an analog front-end for initial signal processing (e.g., filtering and amplification) of the MR signal measurements.

The computing device 120 includes memory 122 corresponding to one or more non-transitory storage media. The memory 122 is configured to store data (e.g., databases 124 and 126) and instructions 128. While the computing device 120 is shown as integrated in the housing of the portable system 106, in other examples it may be connected to the system 106 through a communications interface, such as a wired (e.g., USB or other) or wireless (e.g., Wi-Fi, infrared, or other) link. The computing device 120 includes a processor 130 to access the memory 122 and execute instructions 128 programmed to perform functions disclosed herein. In other examples, the databases 124 and 126 may be remotely implemented, such as in a cloud computing system, web service or other storage network, and accessed by the computing device by a network interface (e.g., wireless or physical connection).

In some examples, the system 100 includes a motion system within or attached to the sample holder to transport the sample from a first field of view associated with the NIR spectrometer 102 to another field of view associated with the MR spectrometer 104. In other examples, the motion system is adapted to reposition at least a detector of the NIR spectrometer 102 and a sensor of the MR spectrometer 104 to sequentially perform respective measurements of the sample compound. In yet another example, the NIR spectrometer 102 and the MR spectrometer 104 perform measurements of the sample concurrently without repositioning thereof.

By way of example, the instructions 128 are programmed for control and data processing functions (e.g., corresponding to methods 10 and 50), which includes program code to control spectrometers 102 and 104 as well as to analyze the NIR data and the MR data to characterize the sample compound. For example, the analysis can include analyzing the NIR data to provide NIR feature data that specifies optical (spectroscopic) properties of the sample compound. The feature data may be in the form of a feature vector that includes a plurality of data points describing the NIR measurements for the sample compound. Additionally or alternatively, the NIR feature data specifies a preliminary identity of the sample compound. The instructions 128 further can be programmed to control performing MR spectroscopy and to analyze the MR data quantitatively, based on the NIR feature data, to further characterize properties, including specifying an identity of the sample compound.

As a further example, the instructions 128 are programmed to search the NIR database 124 based on the NIR feature data (a feature vector) to provide NIR results data in memory 122. The NIR results data thus may specify an initial classification for the sample, such as a category of the sample compound and/or an identity of the sample compound. The NIR results data may be utilized (by instructions 128) to constrain or seed subsequent searching of the MR database 126 based on the MR measurement data, such as to narrow the search space based on the NIR results data. For example, based on the reduced search space or otherwise constraints determined from the NIR results data, the instructions 128 can execute code to conduct a search of the MR database 126 based on the MR measurement data and provide search results to specify the identity of the sample compound. In some examples, the search of the MR database is to authenticate (e.g., validate or invalidate) the identity of the sample compound specified preliminarily in the NIR results data. As disclosed herein, the sample may be a medicinal product, dietary supplement, food or other sample compound requiring authentication of its identity.

The computing device 120 may provide its output to a display 132. For example, the display 132 can provide a visual representation that indicates a positive identification of a dominant compound in the sample being tested. This may further include a category of the sample compound, a name (or names) of the manufacturer and a commercial name of the sample compound (e.g., a brand and generic name). Additionally, or alternatively, the computing device 120 provides its output to the display 132 to specify a quantity of the sample compound.

In a typical scenario, the MR spectrometer uses a strong $B_0$ (e.g., up to about 1 T) for NMR spectrometry, and a weak $B_0$ (e.g., less than about 0.5 mT) for NQR spectrometry. For the example of a portable system 100 within the housing 106, the electromagnetic field source is configured to generate the field $B_0$ in the absence of a superconductor. The electromagnet field source consumes static power but allows the strength of the field $B_0$ to be easily controlled via the current. In contrast, the permanent magnet field source consumes no static power but requires mechanical motion (either of the sample or magnet pieces) to control $B_0$. In an example, the MR spectrometer system 104 includes a radio frequency (RF) power source, a coil to produce the magnetic excitation field and a detector circuit which monitors for an RF MR response from sample under test (in the sample space 108). The detector circuit can include a matching network and an analog front-end for initial signal processing (e.g., filtering and amplification) of the MR signal measurements.

Figure 4:
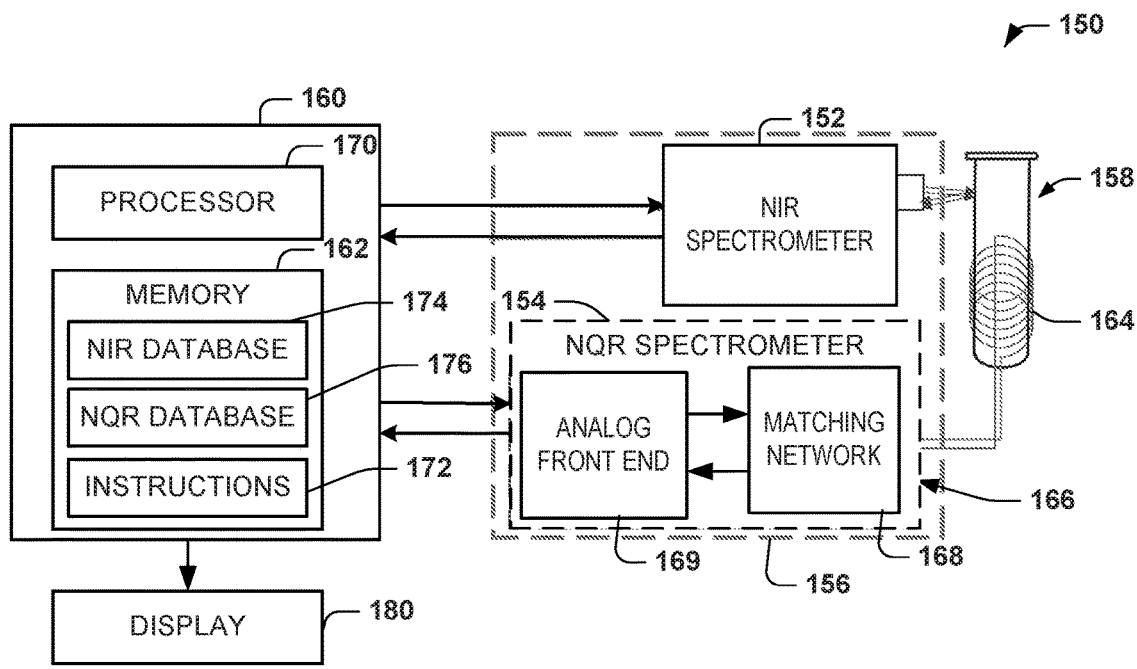
FIG. 4 depicts an example of a system to characterize a sample compound using NIR and NQR spectroscopy.

FIG. 4 depicts an example of a system 150 to characterize a sample compound using multi-modal spectral analysis that includes NIR and NQR. The system 150 includes an NIR spectrometer 152 to record NIR measurements for the sample compound and an NQR spectrometer 154 to record NQR measurements for the sample compound. In this example, the system 150 includes a housing 156 that contains the NIR spectrometer 152 and the NQR spectrometer 154, which is connected to a separate computing device 160 via one or more interfaces for communication of data and instructions. In other examples, the computing device 160 could be integrated in the same housing 156 (e.g., like the example of FIG. 3).

The system 150 includes a sample space 158 configured (e.g., as a sample holder) to receive a volume of the sample compound therein. The sample space 158 may be within the housing 156 or be external to the housing. For example, the sample space 158 may include a receptacle or other sample holder to receive the sample being tested. Different configuration sample spaces may be used for different sizes and types of sample compounds.

For example, the NIR spectrometer 152 includes a light source (e.g., light bulb or LED), a detector (e.g., charge-coupled device (CCD) or other silicon-based detector, InGaAs photodiodes, etc.), and a dispersive element (such as a prism, or, more commonly, a diffraction grating) to allow the intensity at different wavelengths to be recorded.

As an example, the NQR spectrometer system 154 includes a radio frequency (RF) power source, a coil 164 to produce the magnetic excitation field and a detector circuit which monitors for a RF NQR response from sample under test (in sample space 158). The detector circuit 166 can include a matching network 168 and an analog front-end 169 for initial signal processing (e.g., filtering and amplification) of the NQR signal measurements. For example, the matching network 168 is a digitally-controlled impedance matching network that enables the NQR spectrometer to operate in a wide frequency range (e.g., about 0.9-3 MHz). This enables the operating frequency to be set freely by software, while also ensuring comparable sensitivity to narrow band systems over the entire range. Such a system also can quickly switch between multiple resonant frequencies of the same compound to improve the accuracy and reliability of NQR-based chemical analysis of compounds and mixtures.

FIGS. 5A and 5B depicts an example of a pulse sequence and example parameter values for performing NQR spectrometry (e.g., via spectrometer 154). For example, FIG. 5A shows a transmit pulse 182 and a receive signal 184 from a sample compound in response to the magnetic field generated in response to the pulse. The instructions in the computing device 160 (or a separate controller) may control various parameters associated with the spectrometer 154. As shown in FIG. 5B, these can include frequency, pulse length, pulse spacing and peak power.

Referring back to FIG. 4, the recorded measurements from spectrometers 152 and 154 are stored in memory 162 of a computing device (e.g., a PC, laptop, workstation, tablet, smart phone, etc.) 160, which may be local or remotely connected to the system 150 via a communications interface, such as a wired (e.g., USB or other) or wireless (e.g., Wi-Fi, Bluetooth or other) link. The computing device 160 includes a processor 170 to access the memory 162 and execute instructions 172 programmed to perform functions disclosed herein. The memory 162 can be programmed to include an NIR database 174 and an NQR database 176, such as based on empirical studies and machine learning to characterize a variety of samples. The memory 162 may be local and/or remotely located, such as in a computing cloud, web service or other storage network.

In some examples, the system 150 includes a motion system within or attached to the sample holder 158 to transport the sample from a first field of view associated with the NIR spectrometer to another field of view associated with the NQR spectrometer. In other examples, the motion system is adapted to reposition at least a detector of the NIR spectrometer and a sensor of the NQR spectrometer to sequentially perform measurements of the sample compound. In yet another example, the NIR spectrometer and the NQR spectrometer perform measurements of the sample concurrently without repositioning thereof.

By way of example, the instructions 172 are programmed to analyze the NIR data and the NQR data to characterize the sample compound. For example, the analysis can include analyzing the NIR data to provide NIR feature data that specifies optical (spectroscopic) properties of the sample compound. The feature data may be in the form of a feature vector that includes a plurality of data points describing the NIR measurements for the sample compound. Additionally or alternatively, the instructions can further analyze the NIR feature data to specify one or more initial classification for the identity of the sample compound. The instructions 172 further can be programmed to analyze the NQR data quantitatively, based on the NIR feature data, to further characterize properties, including to authenticate and/or specify an identity of the sample compound.

As a further example, the instructions 172 are programmed to search the NIR database 174 based on the NIR feature data (a feature vector) to provide NIR results data. The NIR results data thus may specify a category of the sample compound and/or an identity of the sample compound. The NIR results data may be utilized (by instructions 172) to constrain or seed subsequent searching of the NQR database 176, such as to narrow the search space based on the NIR results data. The instructions can then conduct a search of the NQR database 174 based on the NQR measurement data and provide search results to specify the identity of the sample compound. In some examples, the search of the NQR database is to validate or invalidate the identity of the sample compound specified preliminarily in the NIR results data. The computing apparatus 160 may provide its output to a display 180 or another output to authenticate and/or specify the identity of the sample compound, such as a visual representation as disclosed herein.

While the foregoing systems 100 and 150 describe an example where the NIR and NQR systems are integrated into a portable unit, in other examples, the system may be implemented as an in-line system. For example, an in-line solution can be utilized by pharmaceutical manufacturers and re-packagers (O.E.M.). In other examples, a tabletop device can be utilized in retail (plug and play) settings.

FIG. 6 depicts a block diagram for another example system 200 to characterize a sample compound using multi-modal spectral analysis. The system 200 includes an NIR spectrometer 202 and an MR spectrometer 204. In this example, the MR spectrometer 204 is configured to perform both low field NMR and NQR. The system 200 may be integrated into a housing which may be portable for field use or an in-line system for use in a factory or other processing plant. Each of the NIR and MR spectrometers 202 and 204 may be configured (implementing an arrangement of spectroscopy devices and machine-readable instructions executable on one or more processors) to operate similar to the various other examples described above (e.g., FIGS. 1-5). Briefly, the NIR spectrometer 202 implements NIR measurement 206 to record NIR measurement data with respect to a sample compound 208, which is placed in a sample holder 210. The NIR spectrometer 202 also implements NIR based classification 212 based on the NIR measurement data to provide NIR results data. The NIR results data may include feature data describing optical properties of the sample compound and/or data specifying an initial classification of the sample compound 208.

In this example, the sample holder implements motion control 212 to adjust the position of the sample 208, demonstrated by arrows 215. The motion control could be integrated into the holder itself or in the housing containing the system 200. For example, the motion control 214 controls actuators (e.g., linear actuators and/or rotary actuators) to move the sample holder with respect to the NIR spectrometer and/or MR spectrometer based on the position of the sample holder (e.g., from position sensors or encoders). In an example, the motion control effects motion of the sample holder 210 and sample 208 212 relative to the field source (e.g., 112, 164) of the MR spectrometer 204. By adjusting the position of the sample holder 210 while the sample 208 is placed therein, the magnetic field strength that the sample 208 receives from the MR spectrometer 204 can vary over a range depending on its position. This can be for a static magnetic field as well as a variable field that may be controlled by the spectrometer 204. The MR spectrometer implements low field NMR measurements 216 to record NMR measurement data with respect to a sample compound 208. The MR spectrometer 204 also implements NQR measurements to record NQR measurement data with respect to a sample compound 208. The MR spectrometer 204 can control measurement functions 216 and 218 in sequential operating modes.

Thus, the NIR spectrometer can implement the NIR-based classification 212 for rapid initial classification of the sample 208, such as to indicate one more broad categories based on physical state, product type, etc. or a more particular set of potential identities for the compound. In one example, the NIR classification can be used determine whether low-field NMR or NQR is the most appropriate follow-on analytical method to be implemented by the MR spectrometer 204. In other examples, the NIR classification can control operating parameters for one or both of the low field NMR measurement 216 or NQR measurement 218. The sample is then moved (e.g., by motion control 214) for performing both NMR and NQR analyses depending on whether the sample is placed inside or outside the magnet, respectively.

For example, a common magnetic field generator can supply a magnetic field to a volume in which the sample holder can traverse. The motion control 214 can control the motion of the sample holder 210 according to the operating mode such that the sample is exposed to the field having a first strength for NMR and a second strength for NQR measurements, where the field is smaller for NQR than NMR. The field can be provided by a single field generator and the first and second strengths thereof can vary depending on the position of the sample holder 210 that is adjusted by the motion controller. In an example approach, the magnetic field is kept fixed and a motion controller (e.g., a computerized linear actuator) is used to physically move the sample between a near-zero-field region (outside the magnet) and a high-field region (inside the magnet), such that the magnetic field is smaller (e.g., $B_0$ is smaller than about 0.5 mT) for NQR and is greater for low field NMR than NQR (e.g., $B_0$ is greater than about 0.5 mT, such as in a range from about 0.5 mT to about 1.0 T).

The MR spectrometer system 204 implements MR-based classification based on the NMR measurement data and NQR measurement data, such as disclosed herein. The MR-based classification can further be constrained to a reduced set of analyses and database searching based on the initial NIR-based classification 212. For example, the MR-based classification 220 can combine the MR analysis results with those from the NIR spectrometer to provide aggregate spectroscopic results data. The aggregate spectroscopic results data can be input to an associated computing device (e.g., part of the system or through an interface). The computing device can execute a previously-trained classification model (e.g., a deep convolutional neural network) to perform product identification and authentication.

While the example of FIG. 6 relates to moving the sample holder (e.g., via motion control 214) to change the magnetic field for implementing each of the NIR and NMR measurement modules 216 and 218, in other examples the sample holder and sample may remain stationary and the magnetic field strength varied. In this approach, the value of $B_0$ applied to the spatially fixed sample is controlled (e.g., by the field generator) from a near-zero value (for NQR) to a high value (for NMR). Such control can utilize i) the applied current I in an electromagnet, for which $B_0$ is proportional to I; or ii) the relative motion of permanent magnets, such as the rotation of two concentric Halbach cylinders.

Figure 7:
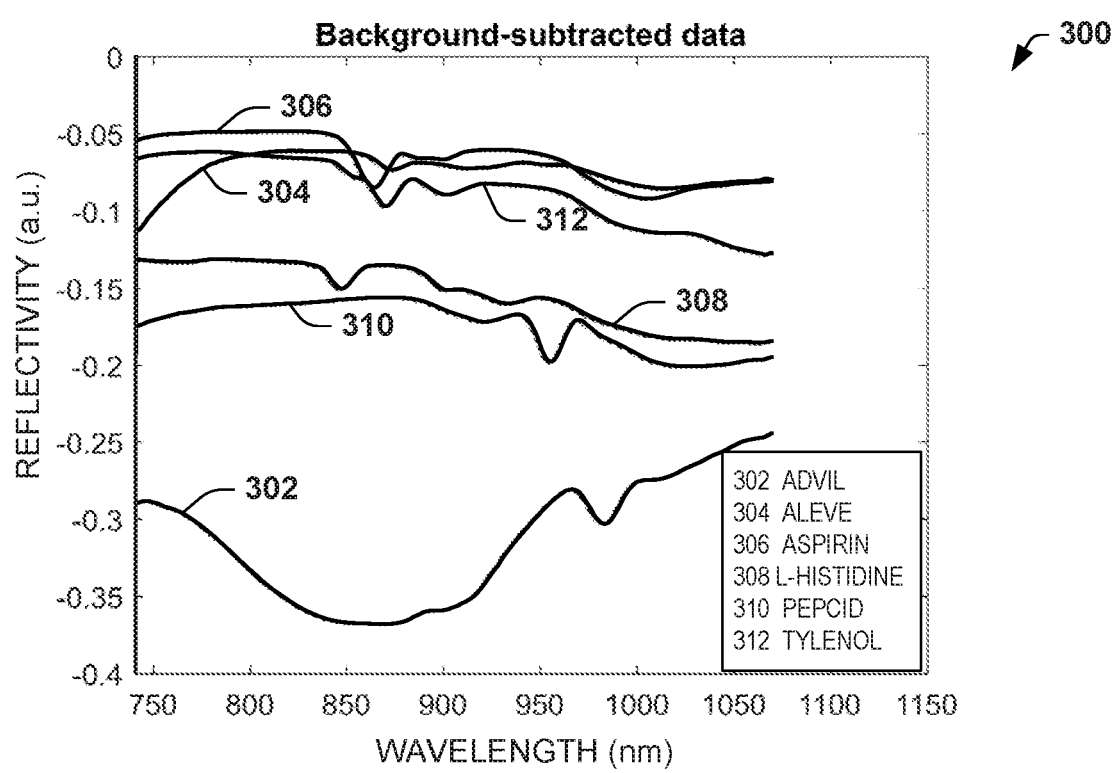
FIG. 7 depicts a graph of reflectivity as a function of wavelength for a plurality of different compounds.

FIG. 7 is a graph 300 of reflectivity plotted as a function of wavelength. The graph 300 shows NIR measurements of single tablets (e.g., using a SCiO NIR spectrometer). The samples include non-prescription drugs and dietary supplements available on the market, although other sample compounds could be used. For example, a single tablet was scanned and the measured signals averaged over multiple scans. Background spectra (from the empty sample holder) were subtracted from the acquired spectra. The plot demonstrates an example using NIR for fast preliminary classification of the sample. However, spectral resolution tends to be poor and the results may be affected by encapsulants, i.e., coatings.

MR (e.g., NQR and low field NMR), on the other hand, is complimentary to NIR as it provides high-resolution spectra that are very specific to the chemistry of the material under investigation, while signal amplitudes are directly proportional to the number of nuclei of a given type present within the detector.

Figure 8:
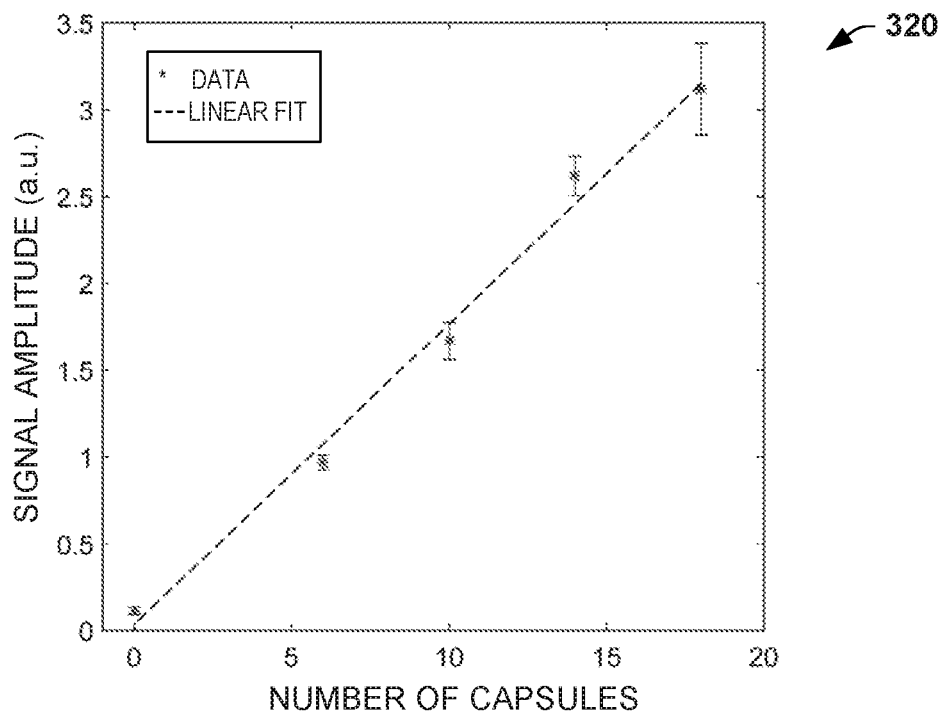
FIG. 8 is a graph depicting NQR signal amplitude as a function of the number of medicinal capsules.

FIG. 8 is a graph 320 depicting NQR signal amplitude as a function of the number of medicinal capsules. For example, FIG. 8 shows measured signal amplitudes as a function of the number of weight-loss drug capsules.

Figure 9:
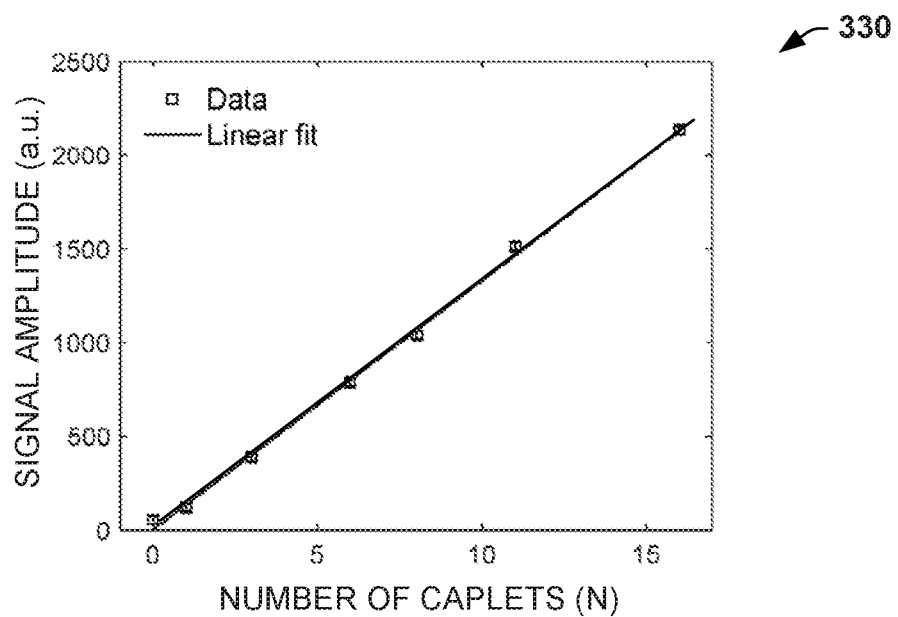
FIG. 9 is a graph depicting NQR signal amplitude as a function of the number of caplets.

FIG. 9 is a graph 330 of NQR signal amplitude as a function of a number of caplets. The graph 340 shows different properties of a sample compound. For instance, FIG. 9 demonstrates that the measured signal amplitude is directly proportional to the number of caplets of a given compound (e.g., Tylenol caplets), and that the sensitivity is high enough to detect single caplets.

In addition, a cross-polarization technique can be used to improve the speed, sensitivity, and signal-to-noise ratio (SNR) of NQR measurements. The basic idea of cross-polarization is that while the proton NMR transition frequency goes to zero during a so-called adiabatic demagnetization, the population difference between proton energy levels remains temporarily unbalanced and available for improvement of the $^{14}$N NQR signal. Specifically, when the proton Larmor frequency becomes close to one of the NQR frequencies, enhanced NQR signals are generated and can be detected later in the zero-field condition. For this purpose, the sample is placed within a small permanent magnet for a variable amount of time ($t_p$) before being removed and placed inside the NQR sensor. The resulting signal amplitude is displayed as a function of $t_p$.

Figure 10:
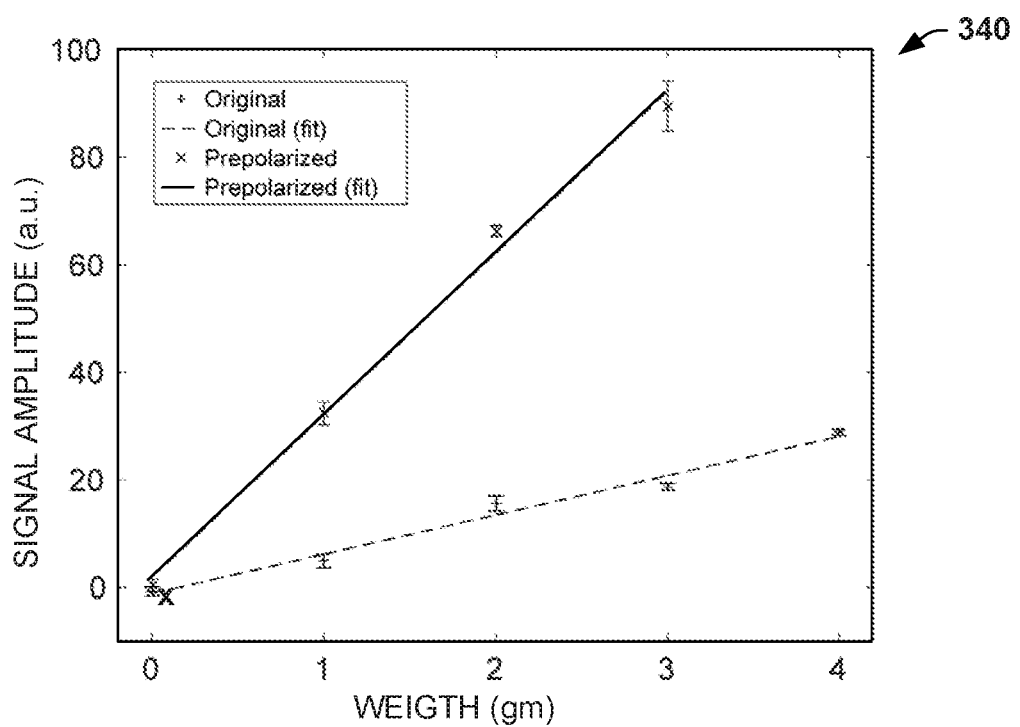
FIG. 10 is a graph depicting a comparison between measured signal amplitudes from compounds with and without cross-polarization.

FIG. 10 is a graph 340 depicting a comparison between measured signal amplitudes from compounds with and without cross-polarization. For example, FIG. 10 shows an example of measured data from melamine. In this example, the samples are all weighted mixtures of melamine and milk powder. The quantity of the melamine varies between different samples while the total sample weight is kept fixed (e.g., at about 40 g). In each case, there is a significant amplitude increase when the sample is pre-polarized for about 60 seconds in the 0.5 T field generated by a low-cost bench top permanent magnet. The amount of enhancement (e.g., approximately 4×) corresponds to a 16× decrease in the time required to obtain a certain signal-to-noise ratio (SNR). Moreover, the cross-polarized signal amplitudes show the same linear relationship versus amount of melamine as the non-cross-polarized ones, demonstrating the efficacy of this technique.

Figure 11:
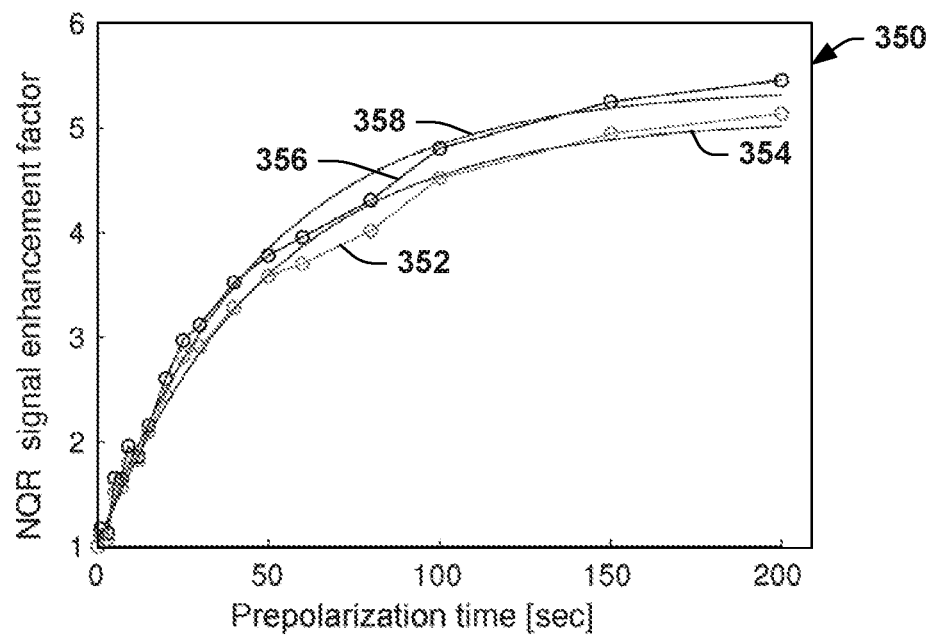
FIG. 11 is a graph showing NQR signal enhancement factors as a function of prepolarization time for NQR measurements on a sample compound.

As a further example, FIG. 11 is a graph 350 of NQR signal enhancement factor as a function of prepolarization time. In this example, the graph 350 demonstrates shows measured NQR data for melamine powder acquired by an automated motion controller. The graph includes curves for both actual data and fitted data for different bandwidths for computing the signal amplitude, demonstrated as 362, 364, 366 and 368. In particular, curve 352 demonstrates actual data and 354 fitted data for a signal bandwidth of 2 kHz in a polarizing field of 0.51 T. Melamine is a known adulterant in milk and feedstock that can make poor quality material appear to be higher in protein content during simple protein tests, but causes serious health problems like kidney stones and renal failure, especially among young children.

Figure 12:
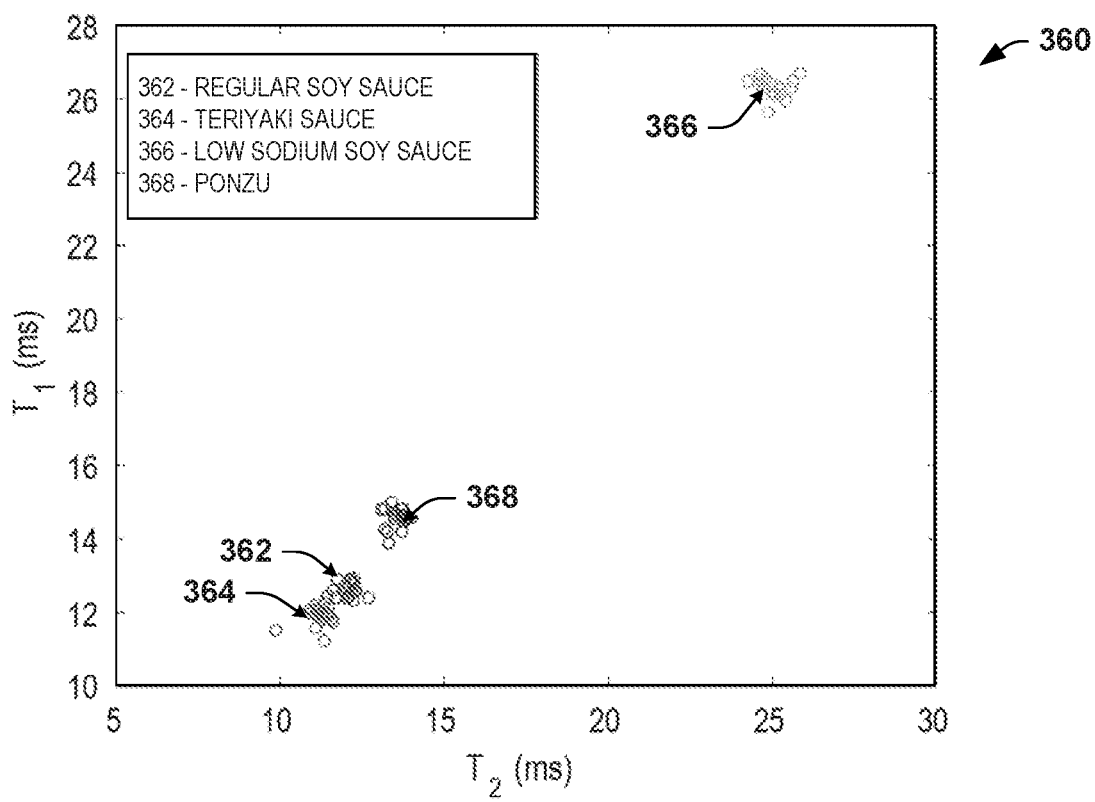
FIG. 12 is a graph showing a correlation between T1 and T2 relaxation data features for different soy sauces.

FIG. 12 is a graph 360 showing a correlation between T1 and T2 relaxation data for different soy sauces that can be generated using low field NMR spectrometry, such as described above. In particular the map includes groups of circles (clusters), demonstrated at 362, 364, 366 and 368, corresponding to T1-T2 feature correlations to classify samples of regular soy sauce, teriyaki sauce, low sodium soy sauce and ponzu, respectively. The collected NMR results data was analyzed to extract a plurality of features for each sample to generate mean T1 and mean T2 values for each sample of the different soy sauces. As shown, the samples tend to form tight clusters 362, 364, 366 and 368 with distinct separation between each of them. Ponzu sauce is particularly distinct. NMR spectrometry can be implemented to identify features for classify other sample compounds.

Figure 13:
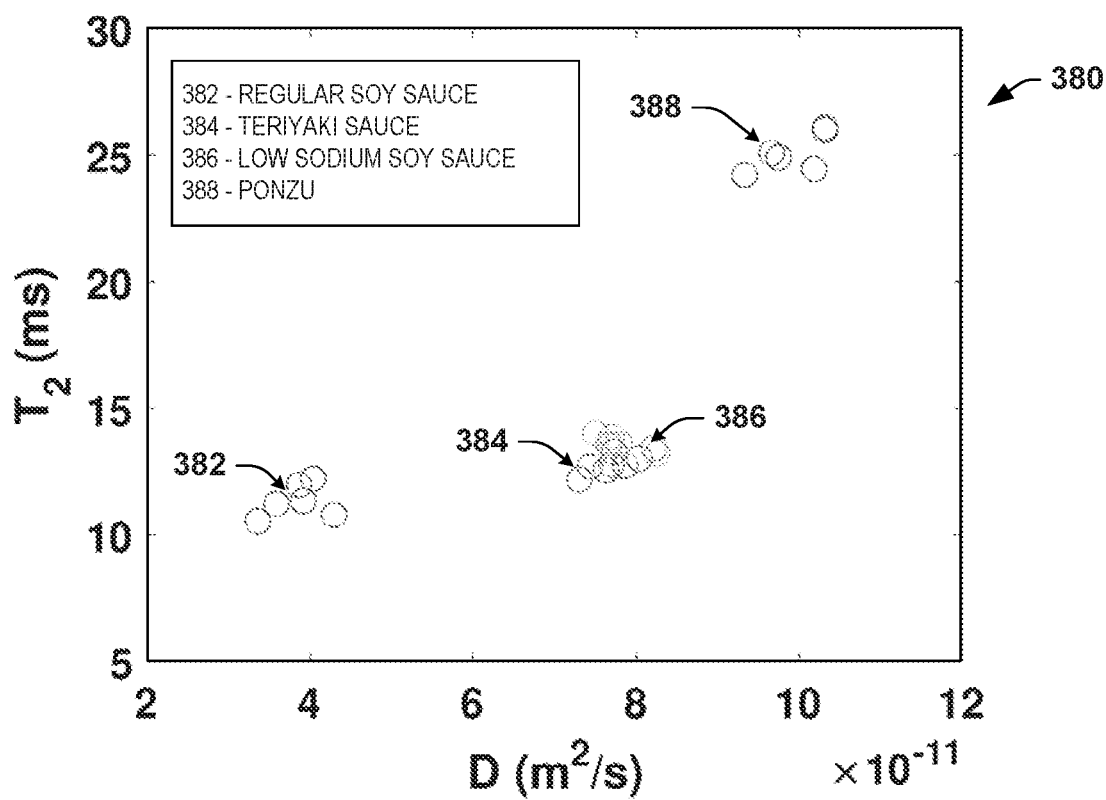
FIG. 13 is another graph showing a correlation between diffusion and T2 relaxation data features for different soy sauces.

FIG. 13 is another graph (e.g., a $^{23}$Na D-T2 map) 380 showing a correlation between diffusion constant D and T2 relaxation data as selected features for use in classifying different soy sauces generated based on low field NMR spectrometry on sample of the different soy sauces. Like FIG. 12, in this example, the map 380 map includes distinct clusters of circles, demonstrated at 382, 384, 386 and 388, corresponding to D-T2 correlations for each of regular soy sauce, teriyaki sauce, low sodium soy sauce and ponzu sauce, respectively. The mean values of T2 matches results from the T1-T2 map; the diffusion constants of different samples differ significantly from each other.

In view of the foregoing, multi-modal analysis methods that combine NIR with MR (e.g., NQR and/or low field NMR) can facilitate authentication of consumables. NIR is able to function as a preliminary filter on the unknown sample, narrowing down the range of categories in a short period of time. Then MR can follow up and generate a more precise analysis, i.e., provide detailed information about the sample to confirm and authenticate the sample compound. Both techniques are low-cost, free of radiation and safety concerns, and easy to use with minimal training. Moreover, they can be integrated into portable devices, such as disclosed herein.

To summarize, systems and methods disclosed herein integrate NQR and NIR spectroscopic sensors to provide for rapid, low-cost, and quantitative analysis and authentication of medicines, dietary supplements and other compounds. The approach combines the merits of MR and NIR spectroscopy in a complimentary manner. As disclosed herein, systems and methods herein afford improved control and display software to sequence scans, fuse features from NIR and MR spectra, calibration, temperature compensation, display results, and perform database management functions (storage and retrieval of acquired spectra). The combination affords fast response time and quantitative chemical component analysis, which further enables significant improvements over traditional approaches for verifying the contents of packaged medicines and supplements. The proposed devices are expected to have a broad range of applications, such as in personal healthcare, customs and border control, and food security to name a few.

In further view of the foregoing structural and functional description, those skilled in the art will appreciate that portions of the invention may be embodied as a method, data processing system, or computer program product. Accordingly, these portions of the present invention may take the form of an entirely hardware embodiment, an entirely software embodiment, or an embodiment combining software and hardware. Furthermore, portions of the invention may be a computer program product on a computer-usable storage medium having computer readable program code on the medium. Any suitable computer-readable medium may be utilized including, but not limited to, static and dynamic storage devices, hard disks, optical storage devices, and magnetic storage devices.

Certain embodiments of the invention have also been described herein with reference to block illustrations of methods, systems, and computer program products. It will be understood that blocks of the illustrations, and combinations of blocks in the illustrations, can be implemented by computer-executable instructions. These computer-executable instructions may be provided to one or more processor of a general purpose computer, special purpose computer, or other programmable data processing apparatus (or a combination of devices and circuits) to produce a machine, such that the instructions, which execute via the processor, implement the functions specified in the block or blocks.

These computer-executable instructions may also be stored in computer-readable memory that can direct a computer or other programmable data processing apparatus to function in a particular manner, such that the instructions stored in the computer-readable memory result in an article of manufacture including instructions which implement the function specified in the flowchart block or blocks. The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions specified in the flowchart block or blocks.

What have been described above are examples. It is, of course, not possible to describe every conceivable combination of structures, components, or methods, but one of ordinary skill in the art will recognize that many further combinations and permutations are possible. Accordingly, the invention is intended to embrace all such alterations, modifications, and variations that fall within the scope of this application, including the appended claims.

Where the disclosure or claims recite "a,", "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A method comprising:
   performing near infra-red (NIR) spectrometry to provide NIR measurement data for a sample compound;
   performing magnetic resonance (MR) spectrometry to provide MR measurement data for the sample compound; and
   analyzing, by a computing device, the MR measurement data to characterize the sample compound,
   wherein at least one parameter for performing the MR spectrometry is controlled based on the NIR measurement data and/or analyzing of the MR measurement data is based on the NIR measurement data.

2. The method of claim 1, wherein analyzing further comprises:
   analyzing, by the computing device, the NIR measurement data to provide NIR feature data to specify optical properties of the sample compound and/or a preliminary identity of the sample compound; and
   analyzing, by the computing device, the MR measurement data, seeded based on the NIR feature data, to characterize properties and/or specify an identity of the sample compound.

3. The method of claim 2, wherein analyzing further comprises:
   performing, by the computing device, a search of an NIR database based on the NIR feature data to provide NIR results data, the NIR results data specifying at least one of a category of the sample compound or an initial identity of the sample compound; and
   performing, by the computing device, a search of an MR database based on the MR measurement data, wherein the search is constrained based on the NIR results data.

4. The method of claim 3, wherein performing the search of the MR database authenticates the identity of the sample compound.

5. The method of claim 3, wherein the NIR results data includes a ranking among a plurality of categories of the sample compound and/or a plurality of potential identities of the sample compound.

6. The method of claim 1, wherein performing the MR spectrometry comprises at least one of:
   performing nuclear quadrupole resonance (NQR) spectrometry to provide NQR measurement data; and
   performing low field nuclear magnetic resonance (NMR) spectrometry to provide NMR measurement data.

7. The method of claim 6, wherein analyzing the MR measurement data comprises analyzing the NQR measurement data and/or analyzing the NMR measurement data to characterize the sample compound.

8. The method of claim 6, further comprising:
   selecting one of the NQR spectrometry or the NMR spectrometry based on the NIR results data; and
   performing the selected one of the NQR spectrometry or the NMR spectrometry.

9. The method of claim 8, further comprising controlling a magnetic field that is applied to the sample compound to perform the selected one of the NQR spectrometry or the NMR spectrometry.

10. The method of claim 1, wherein the sample compound has a known or expected identity, wherein analyzing the MR measurement data further comprises:
    validating the known or expected identity of the sample compound; and
    determining an amount of the sample compound.

11. The method of claim 1, wherein analyzing the NIR data further comprises searching, by the computing device, an NIR database based on the NIR measurement data to provide an NIR feature vector characterizing at least one of an identity and quantity of at least one compound for the sample compound.

12. The method of claim 1, wherein the sample compound comprises a medicinal product, food product or dietary supplement.

13. The method of claim 1, wherein the NIR spectrometry and the MR spectrometry are performed within a common portable housing sequentially or concurrently, the computing device being with the common portable housing or connected to the housing via an interface.

14. A system, comprising:
    a sample space to receive a volume of a sample compound therein;
    a near infra-red (NIR) spectrometer to record NIR measurements for the sample compound within the sample space;
    a magnetic resonance (MR) spectrometer to record MR measurements for the sample compound within the sample space;
    non-transitory memory to store NIR data based on the NIR measurements, MR data based on the MR measurements, and machine readable instructions executable by a processor to perform a method comprising:
    analyzing the NIR data and the MR data to characterize the sample compound, wherein:
    at least one parameter for performing the MR spectrometry is controlled based on the NIR measurement data and/or the analyzing of the MR data is based on the NIR data.

15. The system of claim 14, wherein the analyzing instructions further comprise instructions to:
    analyze the NIR data and provide NIR feature data to specify optical properties of the sample compound and/or a preliminary identity of the sample compound; and
    analyze the MR data, seeded based on the NIR feature data, to characterize properties and/or specify an identity of the sample compound.

16. The system of claim 15, wherein the analyzing instructions further comprise instructions to:
    perform a search of an NIR database based on the NIR feature data to provide NIR results data, the NIR results data specifying at least one of a category of the sample compound or an initial identity of the sample compound; and perform a search of an MR database based on the MR measurement data, wherein the search is constrained based on the NIR results data.

17. The system of claim 16, wherein the search of the MR database is to validate or invalidate the identity of the sample compound specified in the NIR results data.

18. The system of claim 14, further comprising a motion system to transport the sample compound from a first field of view associated with the NIR spectrometer to another field of view associated with the MR spectrometer.

19. The system of claim 18, wherein the motion system is configured to control a level of magnetic field applied to the sample compound by the MR spectrometer.

20. The system of claim 14, wherein performing the MR spectrometer includes at least one of:

a nuclear quadrupole resonance (NQR) spectrometer to perform NQR measurements; and a low field nuclear magnetic resonance (NMR) spectrometer to perform NMR measurements.

21. The system of claim 20, wherein the analyzing instructions further comprise instructions to analyze the NQR measurements and/or the NMR measurements.

22. The system of claim 20, further comprising a magnetic field generator configured to apply a magnetic field utilized by the MR spectrometer.

23. The system of claim 22, wherein the instructions are further to:

control the magnetic field applied to the sample space based on the NIR data, the magnetic field having a field strength based on the NIR data, wherein one of the selected one of the NQR spectrometer or the NMR spectrometer is selected.

24. The system of claim 14, wherein the sample compound comprises a medicinal product, food product or dietary supplement.

25. The system of claim 14, further comprising a housing that contains at least the NIR spectrometer and the MR spectrometer.

* * * * *